(12) United States Patent
Choi et al.

(10) Patent No.: US 12,000,061 B2
(45) Date of Patent: Jun. 4, 2024

(54) EPI-GROWTH APPARATUS OF SEPARATE CHAMBER TYPE

(71) Applicant: T.O.S Co., Ltd., Osan-si (KR)

(72) Inventors: Bum Ho Choi, Goyang-si (KR); Seung Soo Lee, Suwon-si (KR); Yeong Geun Jo, Osan-si (KR); Yong Sik Kim, Suwon-si (KR)

(73) Assignee: T.O.S Co., Ltd., Gyeonggi-do (KR)

( * ) Notice: Subject to any disclaimer, the term of this patent is extended or adjusted under 35 U.S.C. 154(b) by 744 days.

(21) Appl. No.: 17/106,471

(22) Filed: Nov. 30, 2020

(65) Prior Publication Data

US 2021/0310153 A1 Oct. 7, 2021

(30) Foreign Application Priority Data

Apr. 6, 2020 (KR) .................. 10-2020-0041655

(51) Int. Cl.
*C30B 35/00* (2006.01)
*C23C 14/08* (2006.01)
(Continued)

(52) U.S. Cl.
CPC .......... *C30B 23/066* (2013.01); *C23C 14/086* (2013.01); *C23C 14/30* (2013.01);
(Continued)

(58) Field of Classification Search
CPC ....... C23C 14/086; C23C 14/30; C30B 23/02; C30B 23/08; C30B 29/16; C30B 35/00
See application file for complete search history.

(56) References Cited

U.S. PATENT DOCUMENTS 4,385,946 A * 5/1983 Finegan ............ H01L 21/02381
257/E21.334
5,236,509 A * 8/1993 Sioshansi .............. C23C 14/568
204/298.25
(Continued)

FOREIGN PATENT DOCUMENTS

CN 103882385 A 6/2014
JP S64-21973 U 2/1989
(Continued)

OTHER PUBLICATIONS

European Patent Office, English computer translation of JP 201297338 (Year: 2023).*
(Continued)

*Primary Examiner* — Matthew J Song
(74) *Attorney, Agent, or Firm* — Finch & Maloney PLLC

(57) ABSTRACT

Disclosed herein is a separate chamber type epi-growth apparatus including a reaction chamber having a growth space, a substrate mounting unit disposed in the growth space and allowing a substrate to be mounted thereon, a metal oxide treating unit treating a metal oxide in a space independent from the growth space so that metal ions and oxygen ions generated from the metal oxide are supplied to the substrate, an arsenic supply unit installed to face the substrate and supplying arsenic ions to the substrate, an oxygen radical supply unit installed to face the substrate, dissociating oxygen molecules in a gaseous state, and supplying oxygen radicals to the substrate, and a vacuum control unit independently controlling a vacuum state of the reaction chamber and the metal oxide treating unit.

12 Claims, 4 Drawing Sheets

(51) Int. Cl.
    *C23C 14/30*     (2006.01)
    *C30B 23/06*     (2006.01)
    *C30B 23/08*     (2006.01)
    *C30B 29/16*     (2006.01)
    *H01L 21/02*     (2006.01)

(52) U.S. Cl.
    CPC .............. *C30B 23/08* (2013.01); *C30B 29/16* (2013.01); *C30B 35/00* (2013.01); *H01L 21/02554* (2013.01); *H01L 21/02631* (2013.01)

(56) References Cited

U.S. PATENT DOCUMENTS

| | | | |
|---|---|---|---|
| 7,838,083 B1 * | 11/2010 | Youchison | C23C 14/48 427/595 |
| 11,434,584 B2 * | 9/2022 | Choi | C23C 14/086 |
| 2006/0233969 A1 | 10/2006 | White et al. | |
| 2007/0042216 A1 | 2/2007 | Matsumoto et al. | |
| 2008/0226220 A1 * | 9/2008 | Forbes | B82Y 20/00 385/39 |
| 2013/0224889 A1 * | 8/2013 | Koyama | H01L 21/28211 118/723 R |
| 2017/0186984 A1 * | 6/2017 | Hosono | C23C 14/3414 |
| 2020/0377991 A1 * | 12/2020 | Morishima | C23C 14/14 |

FOREIGN PATENT DOCUMENTS

| | | | | |
|---|---|---|---|---|
| JP | H117200 A | | 3/1999 | |
| JP | 2002068889 A | | 3/2002 | |
| JP | 2004095452 A | | 3/2004 | |
| JP | 2004269338 A | | 9/2004 | |
| JP | 2005120441 A | * | 5/2005 | ............. C23C 14/30 |
| JP | 2005537644 A | | 12/2005 | |
| JP | 2007039785 A | | 2/2007 | |
| JP | 2010106339 A | | 5/2010 | |
| JP | 2012097338 A | * | 5/2012 | ............. C23C 14/24 |
| JP | 2012172261 A | | 9/2012 | |
| JP | 2013147683 A | | 8/2013 | |
| JP | 2014092167 A | | 5/2014 | |

OTHER PUBLICATIONS

European Patent Office, English computer translation of JP 2005120441 (Year: 2023).*
Chinese Office Action Corresponding to 2020113940947 dated Dec. 1, 2022.
Korean Office Action Corresponding to 10-2020-0041655 dated Jul. 8, 2021.
Japanese Office Action Corresponding to 2020-200565.

* cited by examiner

EPI-GROWTH APPARATUS OF SEPARATE CHAMBER TYPE

CROSS REFERENCE TO RELATED APPLICATION

This application claims the benefit of Korean Patent Application No. 10-2020-0041655, filed on Apr. 6, 2020, entitled "EPI-GROWTH APPARATUS OF SEPARATE CHAMBER TYPE", which is hereby incorporated by reference in its entirety into this application.

BACKGROUND

Field

The present invention relates to an epi-growth apparatus used for growing an epi-layer on a wafer.

Description of the Related Art

In general, apparatuses for growing an epi-layer (i.e., epitaxial layer), which is a very thin semiconductor thin film, typically include a molecular beam epitaxy (MBE) apparatus, a metal organic chemical vapor deposition (MOCVD) apparatus, an ion-beam assisted deposition (IBAD) apparatus, a pulsed laser deposition (PLD) apparatus, and the like.

One of the epi-growth apparatuses including a combination of the aforementioned apparatus includes an apparatus in which an oxide evaporation source and an electron beam evaporation apparatus, an oxide evaporation apparatus using a laser and an evaporation source, an oxygen and arsenic supply apparatuses, etc. are provided in one chamber, in which the oxide evaporation source, the oxygen supply apparatus, and the arsenic ion supply apparatus are not physically separated and suitable for a small-area process, and which enables up to a 2-inch substrate 2-sheet process.

In order to grow an epi-layer with high quality using such an apparatus, it is very important to maintain an ultra-high vacuum environment at a pressure of $10^{-8}$ to $10^{-11}$ torr of a vacuum chamber in which the epi-layer is grown. However, when an evaporation source is exhausted and needs to be replaced, the environment of the vacuum chamber in the ultra-high vacuum state should be converted to atmospheric pressure, and the evaporation source should be replaced, and then the state of the vacuum chamber should be changed to the ultra-high vacuum state. Here, a vacuum chamber of the epi-layer growth apparatus capable of performing a process of a large area of 1 m or greater, for example, which allows 40 4-inch substrates to be mounted therein, has a volume of up to 3600 $m^3$ and it takes more than 30 hours to create the ultra-high vacuum environment at the pressure of $10^{-8}$ to $10^{-11}$ torr again at atmospheric pressure.

In addition, if the vacuum environment changes frequently, the components mounted in the vacuum chamber are aged quickly, the vacuum chamber itself also has a leak phenomenon due to fatigue accumulation so a lifespan thereof is shortened, and due to this, it is difficult to maintain the reaction chamber in the ultra-high vacuum state at the pressure of $10^{-8}$ to $10^{-11}$ torr.

Furthermore, when oxygen is used for epi-layer growth, oxidation occurs due to oxygen, which adversely affects the evaporation source. In epi-growth apparatuses that perform the process of growing an epi-layer on a large-area substrate of 1 meter or greater to ensure productivity, the use of oxygen is large, so the oxidation of the mounted components including the evaporation source due to the increase in the amount of oxygen emerges as a serious problem.

SUMMARY

An object of the present invention is to provide a separate chamber type epi-growth apparatus capable of significantly reducing time required for adjusting vacuum when an evaporation source is replaced, while a large area or a large number of substrates are handled.

Another object of the present invention is to provide a separate chamber type epi-growth apparatus capable of preventing oxidation of major components due to oxygen, while a large amount of oxygen is supplied in a large area or a large amount of substrates to grow an epi-layer.

According to an exemplary embodiment of the present invention, there is provided a separate chamber type epi-growth apparatus, including: a reaction chamber having a growth space; a substrate mounting unit disposed in the growth space and allowing a substrate to be mounted thereon; a metal oxide treating unit treating a metal oxide in a space independent from the growth space so that metal ions and oxygen ions generated from the metal oxide are supplied to the substrate; an arsenic supply unit installed to face the substrate and supplying arsenic ions to the substrate; an oxygen radical supply unit installed to face the substrate, dissociating oxygen molecules in a gaseous state, and supplying oxygen radicals to the substrate; and a vacuum control unit independently controlling a vacuum state of the reaction chamber and the metal oxide treating unit.

Here, the metal oxide treating unit may include: a metal oxide treatment chamber having an evaporation space independent from the growth space; a mount disposed in the evaporation space to face the growth space and allowing a zinc oxide plate as the metal oxide to be installed thereon; an electron beam irradiator irradiating the zinc oxide plate with an electron beam to cause zinc ions and oxygen ions to be evaporated from the zinc oxide plate; and a gate valve allowing the evaporation space to communicate with the growth space so that the evaporated zinc ions and the oxygen ions move toward the substrate located in the growth space.

Here, the vacuum control unit may include: a first pump acting on the growth space; and a second pump acting on the evaporation space, wherein the second pump may operate to control a vacuum state of the evaporation space independently from the growth space when the gate valve is closed.

Here, the gate valve may be selected to have a size proportional to a size of the substrate.

Here, the metal oxide treatment chamber may further include a replacement door allowing access to the mount for replacement of the zinc oxide plate.

Here, the substrate mounting unit and the electron beam irradiator may be located at a level corresponding to an upper side of the reaction chamber, and the mount may be located at a level corresponding to a lower side of the reaction chamber.

Here, the metal oxide treating unit may further include a camera installed in the evaporation space and imaging an evaporation state of the zinc oxide plate.

Here, the arsenic supply unit may operate in a range of 500° C. to 1,100° C. to ionize arsenic, and supply $As_2^+$ as the arsenic ions.

Here, the oxygen radical supply unit and the arsenic supply unit may be located on mutually opposite sides with respect to the substrate mounting unit.

According to the separate chamber type epi-growth apparatus of the present invention described above, the reaction chamber in which an epi-layer grows and the metal oxide treating unit that evaporates metal ions and oxygen ions from a metal oxide are separated into independent spaces, and a vacuum state of the latter is independently controlled from the former, whereby a vacuum state may be independently controlled only for the metal oxide treating unit when an evaporation source is replaced, while an epi-layer is grown on a large-area or a large amount of substrates, and thus a required time thereof may be remarkably shortened compared to a case where a vacuum state is controlled on the whole. In addition, it is possible to reduce leakage due to aging of components and accumulation of fatigue due to frequent changes in vacuum states.

In addition, since the metal oxide treating unit is structurally separated from the reaction chamber, oxidation of the components on the metal oxide treating unit side by oxygen supplied into the reaction chamber may be effectively prevented.

DETAILED DESCRIPTION

Figure 1:
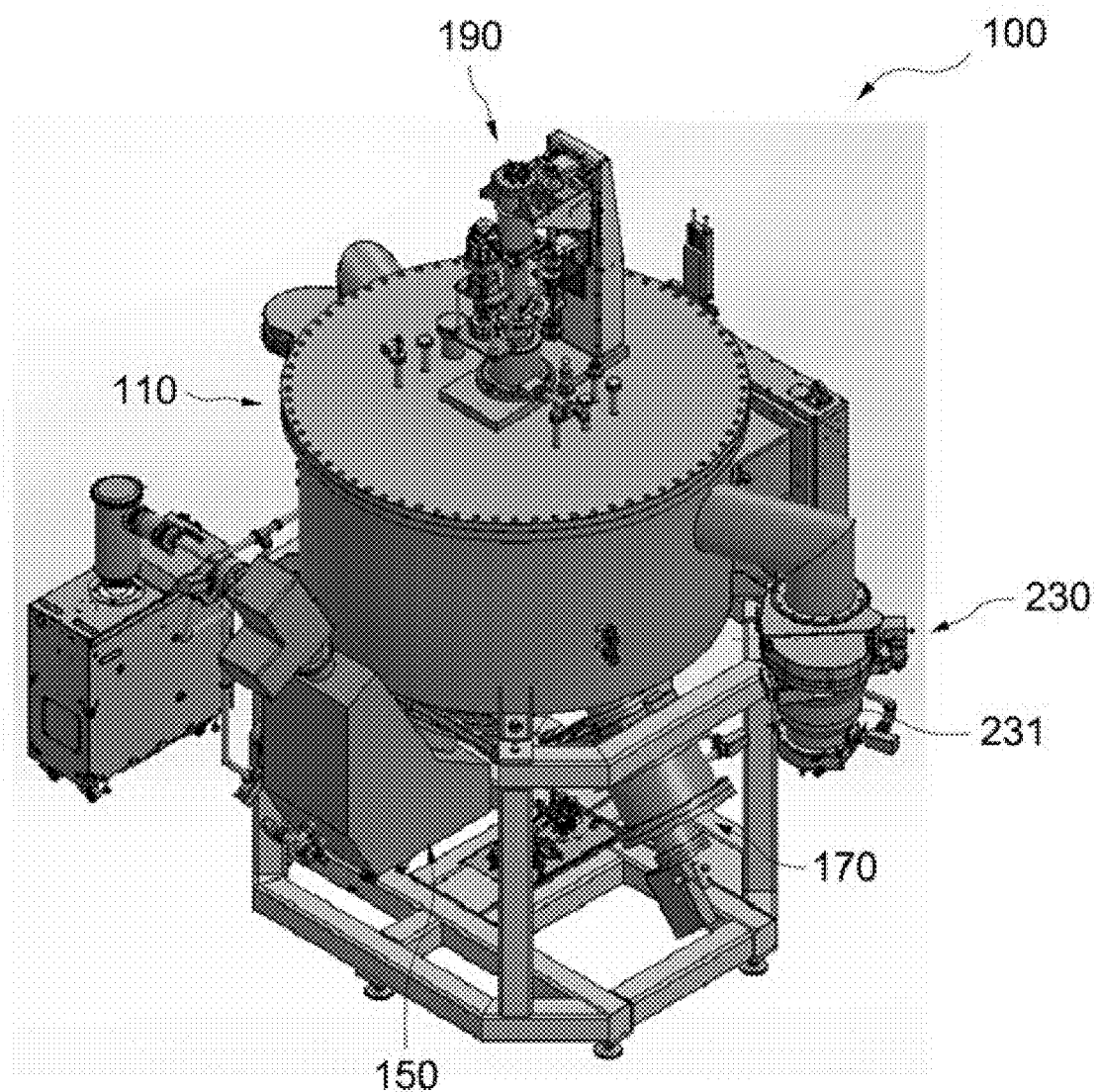
FIG. 1 is a conceptual diagram of a separate chamber type epi-growth apparatus 100 according to an embodiment of the present invention.

Hereinafter, a separate chamber type epi-growth apparatus according to a preferred embodiment of the present invention will be described in detail with reference to the accompanying drawings. In the present invention, the same or similar reference numerals are assigned to the same or similar components even in different embodiments, and a description thereof is replaced with a first description.

Figure 2:
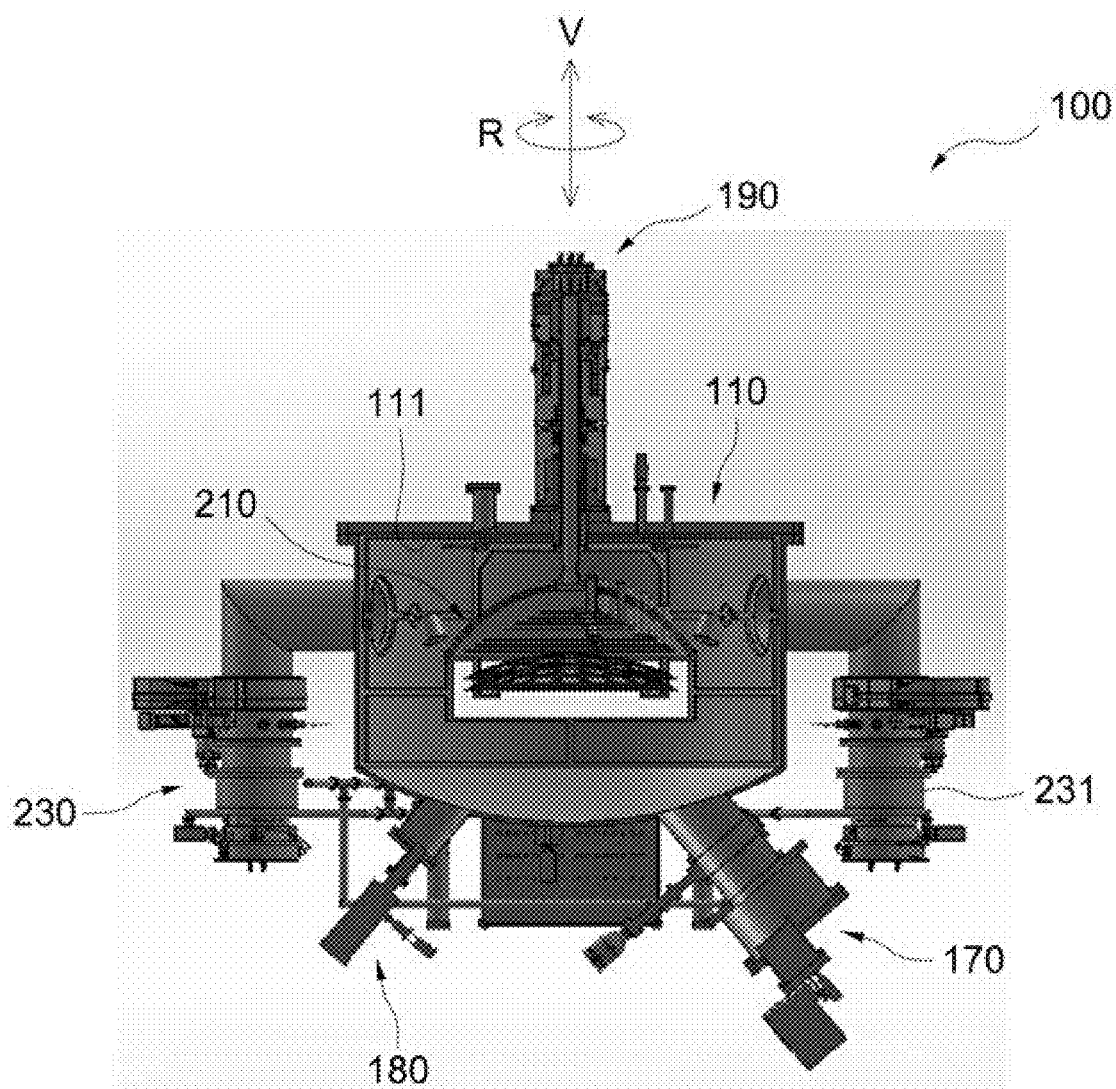
FIG. 2 is a cross-sectional view of a separate chamber type epi-growth apparatus 100 of FIG. 1 in one direction.
Figure 3:
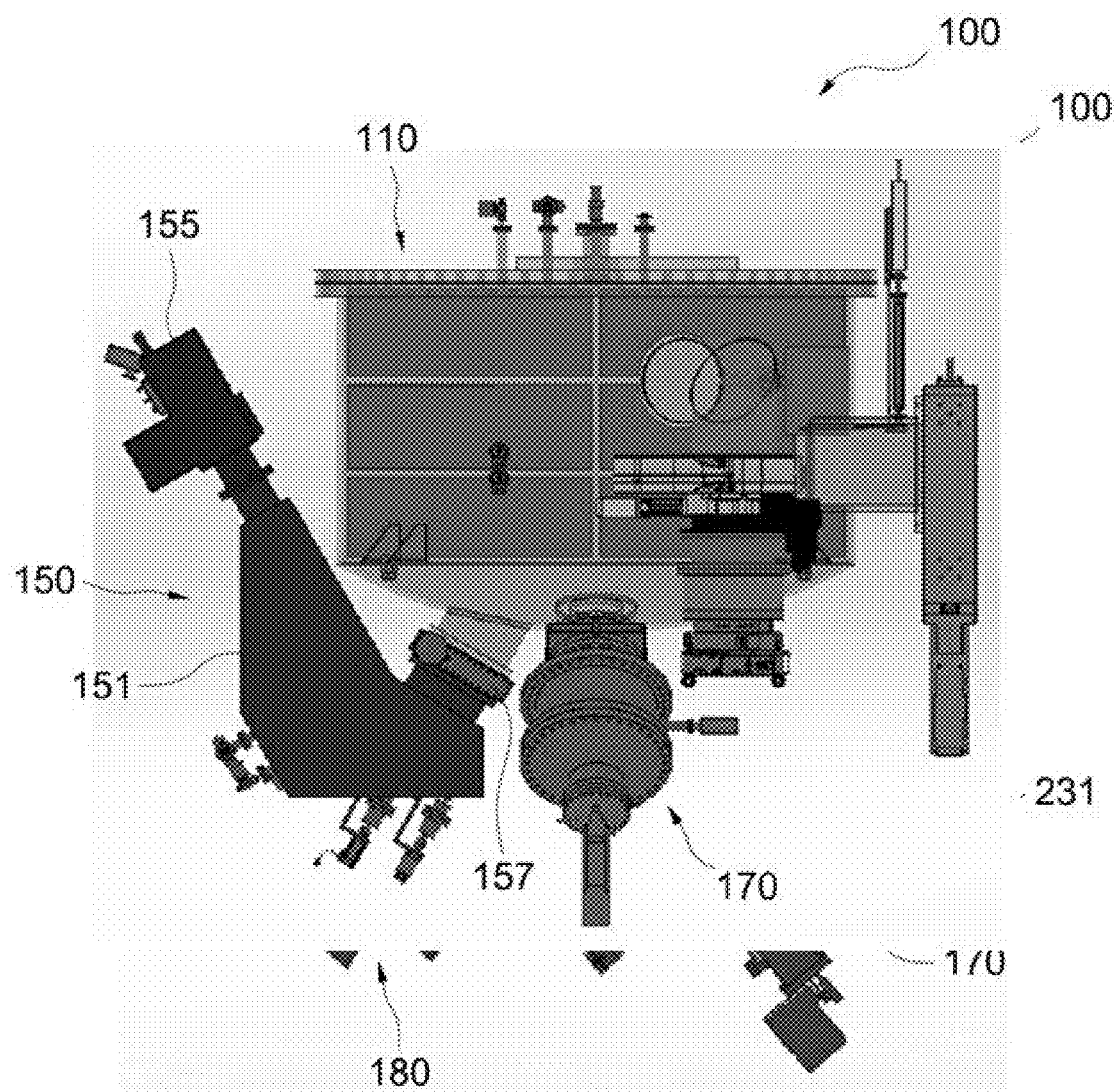
FIG. 3 is a cross-sectional view of the separate chamber type epi-growth apparatus 100 of FIG. 1 in another direction.

FIG. 1 is a conceptual diagram of a separate chamber type epi-growth apparatus 100 according to an embodiment of the present invention, FIG. 2 is a cross-sectional view of the separate chamber type epi-growth apparatus 100 of FIG. 1 in one direction, and FIG. 3 is a cross-sectional view of the separate chamber type epi-growth apparatus 100 of FIG. 1 in another direction.

Referring to FIG. 1, the separate chamber type epi-growth apparatus 100 may selectively include a reaction chamber 110, a substrate mounting unit 130, a metal oxide treating unit 150, an oxygen radical supply unit 170, an arsenic supply unit 180, a driving unit 190, a heater unit 210, and a vacuum control unit 230.

The reaction chamber 110 includes a growth space 111, and a high-purity zinc oxide thin film growth process is performed in the growth space 111. The growth space 111 may have a volume of at least 3,600 L to accommodate a large number of wafers or a large-scale wafer. In terms of pressure, the growth space 111 is basically in a vacuum state of $10^{-8}$ to $10^{-9}$ torr, and $10^{-5}$ to $10^{-6}$ torr during growth. To this end, a first pump 231 of the vacuum control unit 230 communicates with the growth space 111. The first pump 231 is a pair and may be installed on both sides of the growth space 111, respectively.

The reaction chamber 110 may be connected to a loadlock chamber. The loadlock chamber may be divided into two spaces, i.e., a substrate storage area maintaining a vacuum level of $10^{-3}$ torr and a substrate transfer area maintaining a vacuum level of $10^{-8}$ to $10^{-9}$ torr. The loadlock chamber may include an automatic transfer device for transferring the substrate mounting unit 130 on which a substrate W is mounted, a preheating unit for shortening an outgassing time of metal-oxides, and a slot capable of keeping at least five substrate holders in storage. The degree of vacuum of the loadlock chamber may be maintained at a level of $10^{-8}$ to $10^{-9}$ torr, which is a vacuum level of the reaction chamber 110 during the process. The transfer of the substrate W between the loadlock chamber and the reaction chamber 110 is performed by a robot.

The substrate mounting unit 130 is disposed in the growth space 111 and allows a substrate W to be mounted thereon. The substrate mounting unit 130 has a size for mounting a large-scale substrate of 1 m or greater or a large number of (e.g., or greater) 4-inch sapphire substrates. The substrate mounting unit 130 is transported from the loadlock chamber and attached to a cradle installed in the reaction chamber 110. To this end, four electromagnets are installed at a connection portion between the cradle and the substrate mounting unit 130 to attach the cradle and the substrate mounting unit 130, and thereafter, the substrate mounting unit 130 may be moved up to a position where a temperature of the substrate W is maintained at 550° C. to 800° C. in proximity to the heater unit 210 located above when the epi layer is grown. In order to transport the substrate mounting unit 130 to the loadlock chamber, the cradle may be lowered by about 80 mm after completion of the epi layer growth process, a magnetic field of the electromagnets is released so that the substrate mounting unit 130 may be seated in a transportation system, and the transported substrate mounting unit 130 may be kept in a slot provided in the loadlock chamber. In order to control a position of the substrate mounting unit 130, a position sensor may be installed at a position at which the substrate mounting unit 130 is attached to the cradle and a position from which the substrate mounting unit 130 needs to move up for the epi layer growth process, thereby controlling an accurate position of the substrate mounting unit 130.

The metal oxide treating unit 150 is configured to treat a metal oxide, which is an evaporation source, so that metal ions and oxygen ions generated from the metal oxide are supplied to the substrate W. The metal oxide treating unit 150 is structurally separated from the reaction chamber 110 and is installed outside the reaction chamber 110. Accordingly, the treatment of the metal oxide is performed in a space independent from the growth space 111, and the metal ions and oxygen ions generated as a result may be supplied to the growth space 111 and deposited on the substrate W.

The oxygen radical supply unit 170 is configured to supply oxygen radicals O to the substrate W by dissociating oxygen molecules in a gaseous state. The oxygen radical supply unit 170 is installed in the reaction chamber 110 to face the substrate W.

When a zinc oxide single crystal is grown, the ratio of Zn:O should be 1:1 in theory. However, when an actual component analysis is performed, a phenomenon in which the ratio of O is lower than that of Zn naturally occurs due to the nature of the zinc oxide thin film. Therefore, in order to adjust the ratio of Zn:O to 1:1, oxygen radicals are supplied to the substrate W through the oxygen radical supply unit 170. Here, the supplied oxygen should be oxygen radicals dissociated by heat or plasma, rather than $O_2$.

As RF plasma dissociation device may be used as the oxygen radical supply unit 170, which is mounted under the reaction chamber 110. The RF plasma dissociation device may have a shutter at an end thereof in order to prevent spitting or clogging at the beginning of oxygen radical supply. In addition, the RF atom source has a nozzle for injecting oxygen radicals into the growth space 111 and includes an RF plasma source and power supply device for dissociation of O2, an impedance matching system, and the like. Direct plasma or remote plasma may be selected as the plasma system, but in this embodiment, a remote plasma method is selected to minimize the effect of plasma.

In order to efficiently dissociate $O_2$, RF plasma power may be used in the range of 300 W to 750 W, and in the case of a process of treating 40 4-inch substrates at once, 100 W is preferably suitable. A distance between a discharge port of the oxygen radical supply unit 170 for supplying oxygen radicals and the substrate W is 800 mm to 1,400 mm, and preferably, 800 mm.

Figure 4:
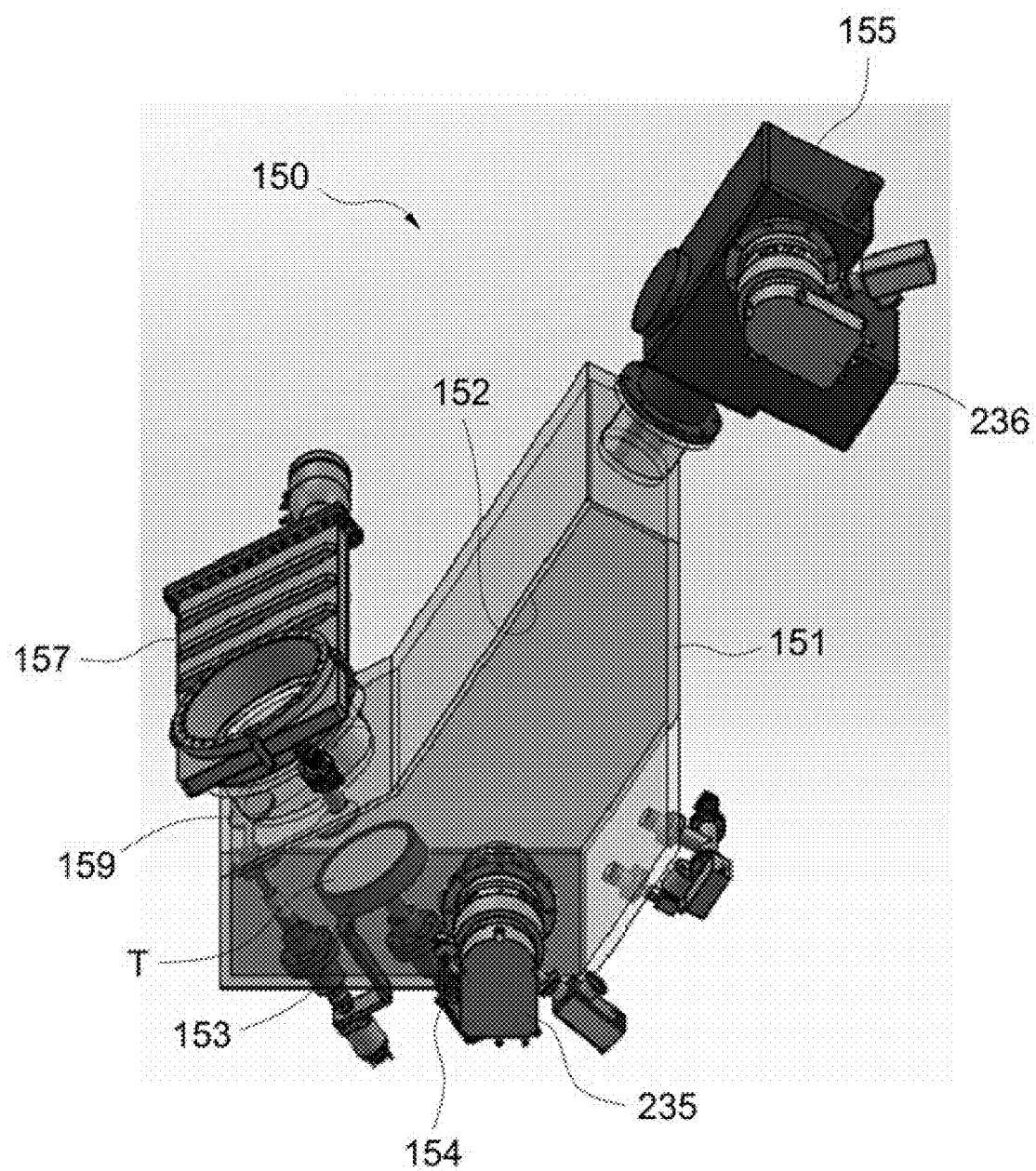
FIG. 4 is a perspective view of the metal oxide treating unit 150 of FIG. 1.

Further, in order to prevent oxidation of peripheral components by oxygen radicals supplied from the oxygen radical supply unit 170, the metal oxide treating unit 150 is installed outside the reaction chamber 110 so as to be separated from the growth space 111 of the reaction chamber 110, and is configured to allow evaporation to be performed in an internal space thereof (evaporation space 152, FIG. 4). As a result, the space for evaporation of the metal oxide and the space to which oxygen radicals are supplied (growth space 111) are spatially separated from each other and do not overlap each other, so that supply of oxygen to the component for evaporation may be minimized.

The arsenic supply unit 180 is a component for supplying arsenic ions to the substrate W. The arsenic supply unit 180 may be installed on the bottom of the reaction chamber 110 and disposed to face the substrate W.

As the arsenic supply unit 180, for example, a Knudsen cell (K-cell) may be used. The arsenic supply unit 180 decomposes arsenic, which is solid at room temperature, at a temperature range of 500 to 1,100° C., preferably 600 to 1,100° C., and supplies ions in the $As^{2+}$ state to the substrate W. In the case of supplying $AS_4^+$, among arsenic ions, to the substrate W, a high-quality p-type zinc oxide film is not formed because chemical bonds between Zn—O—As do not match. Therefore, it is important to produce $As_2^+$ in the above temperature range. The arsenic supply unit 180 may further have a control valve to adjust the amount of arsenic ions (ultimately $AS_2^+$ doping concentration) to suit the characteristics of the epi thin film in a range of $10^{17}$ to $10^{21}$ pcs/cm$^3$.

In order to control an increase in an impurity concentration due to a spitting phenomenon of $AS_2^+$ acceptors at the beginning of decomposing arsenic and supplying decomposed arsenic to the substrate, the arsenic supply unit 180 has its own shutter and a heater unit for applying heat to decompose arsenic. In addition, the arsenic supply unit 180 may include a reservoir for storing arsenic.

The arsenic supply unit 180 may be located on the opposite side of the oxygen radical supply unit 170 with respect to the substrate mounting unit 130. Accordingly, the arsenic supply unit 180 may be relatively free from oxidation by oxygen radicals discharged from the oxygen radical supply unit 170.

The driving unit 190 is a component for driving the substrate mounting unit 130. The driving unit 190, in a state of being connected to the substrate mounting unit 130, may be installed in the reaction chamber 110. Specifically, the driving unit 190 may cause the substrate mounting unit 130 to move in a direction away from or close to the bottom of the reaction chamber 110 in a vertical direction V. Furthermore, the driving unit 190 may rotate the substrate mounting unit 130 in a rotation direction R.

Specifically, the driving unit 190 may move the substrate mounting unit 130 up and down 50 to 100 mm, preferably, 80 mm, in the vertical direction V. In addition, for uniform thin film deposition on the substrate W, the driving unit 190 may rotate the substrate mounting unit 130 at a speed of 5 to 50 rpm, preferably, 10 rpm. In this case, the driving unit 190 may rotate only the cradle so that the entire substrate mounting unit 130 rotates substantially.

The heater unit 210 may be provided to correspond to the substrate mounting unit 130 to heat the substrate W. The heater unit 210 may be installed in the reaction chamber 110 or the driving unit 190 and located in the growth space 111. The heater unit 210 may operate at 750° C. to 1,000° C. so that the substrate W may be maintained at a temperature of 550° C. to 800° C. during film formation. One to four heater units 210 may be installed to uniformly maintain a temperature of the entire substrate W, and the installed heater units 2210 may each control a temperature independently. The heater unit 210 is designed to transfer heat to the substrate W by radiant heat in a vacuum.

The vacuum control unit 230 is a component for independently controlling a vacuum state for the reaction chamber 110 and the metal oxide treating unit 150. To this end, the vacuum control unit 230 has a first pump 231 acting on the growth space 111. In addition, the vacuum control unit 230 has a second pump (not shown) acting on a metal oxide treatment chamber 151 (see FIG. 4) of the metal oxide treating unit 150. Here, the first pump 231 and the second pump may be adjusted to operate independently of each other.

In the above, the metal oxide treating unit 150 will be described in more detail with reference to FIG. 4. FIG. 4 is a perspective view of the metal oxide treating unit 150 of FIG. 1.

Referring to this drawing (and FIGS. 1 to 3), the metal oxide treating unit 150 may selectively include a metal oxide treatment chamber 151, a mount 153, an electron beam irradiator 155, a gate valve 157, and a camera 159.

In the present embodiment, the treatment of the metal oxide refers to irradiating the metal oxide with an electron beam so that the metal ions and oxygen ions are evaporated to move toward the substrate W. Such a treatment is performed in the metal oxide treatment chamber 151, specifically, an evaporation space 152 which is an internal space thereof. The metal oxide treatment chamber 151 is a structure independent from the reaction chamber 110 on the outside of the reaction chamber 110 and makes the evaporation space 152 a space independent from the growth space 111. The evaporation space 152 has a size smaller than that of the growth space 111. As an example, the former may have a volume of about ¼ of that of the latter.

The metal oxide above may be a zinc oxide plate T as a specific example, which may be manufactured by sintering zinc oxide powder. Accordingly, the metal ion may be $Zn^{2+}$ and the oxygen ion may be $O^{2-}$. The zinc oxide plate T has a diameter of 8 inches and a thickness of 2 inches, and has a capacity of 900 cm$^3$ when 100% vaporization is assumed. This is an amount that may be used for several months and is suitable for mass-production. In the zinc oxide plate T, a temperature of the zinc oxide in a region sublimated from a solid state to a gaseous state by the irradiated electron beam is between 1,000 and 1,500° C. and a melting point is 1,950° C.

The zinc oxide plate T may be installed on the mount 153. The mount 153 is installed in the evaporation space 152 and is disposed to face the growth space 111, specifically, the substrate mounting unit 130. To this end, the mount 153 is located at a level corresponding to a lower side of the reaction chamber 110.

The zinc oxide plate T may have a shutter at an end thereof to prevent a spitting phenomenon or a clogging phenomenon at an initial stage of supplying zinc and oxygen gases produced by electron beam irradiation. The shutter may be controlled by a motor so that it may move according to an area irradiated with the electron beam and has a circular shape having a size of 2 to 9 inches, and preferably, 4 inches.

Zinc oxide is a ceramic-based material and has a low thermal conductivity of only about 5 W/mK, which is 14% of that of metal. Deformation due to thermal stress occurring in the zinc oxide plate T due to a temperature difference between an evaporation region having a locally high temperature and other regions by electron beam irradiation should be prevented. To this end, a heater unit (not shown) may be installed to minimize the temperature gradient around the zinc oxide plate T. Such a heater unit may be installed on the mount 153 to surround the zinc oxide plate T, and the zinc oxide plate T may be divided into at least five temperature regions and the heater unit may differentially heat the regions such that a temperature difference between each region does not exceed 300° C.

As a method of increasing use efficiency of the zinc oxide plate T by creating a uniform erosion profile of the zinc oxide plate T, a mechanism 154 that rotates the zinc oxide plate T at regular intervals of use may be additionally provided on the mount 153. A rotation angle of the zinc oxide plate T may be 45° and the zinc oxide plate T may be rotated a total of 8 times until its replacement.

An electron beam irradiator 155 for irradiating the zinc oxide plate T with an electron beam is installed above the evaporation space 152. The electron beam irradiator 155 is substantially at the same level as the substrate mounting unit 130 and may be located at a level corresponding to an upper portion of the reaction chamber 110.

The electron beam irradiator 155 is configured to irradiate the zinc oxide plate T with an electron beam in a direct manner. The irradiation angle may preferably be within 20°. In a case where an acceleration voltage of the electron beam is high, it is important to minimize the amount of secondary electrons generated after irradiation on the zinc oxide plate T. If the irradiation angle of the electron beam exceeds 40°, the ratio of generated secondary electrons rapidly increases to reach a level of 50%, which works as factors that adversely affect zinc oxide evaporation efficiency, zinc oxide plate T use efficiency, and contamination of a wall of the reaction chamber 110, and thus it is preferable to adjust the irradiation angle within 20°.

As for the electron beam irradiated from the electron beam irradiator 155, maximum power is 60 kW using an acceleration voltage in the range of 5 to 30 kV and an emission current of up to 2 A. Preferably, 30 kW using an acceleration voltage of kV and an emission current of 1 A may be maximum power.

The zinc oxide plate T should be installed to have a certain angle for smooth supply of zinc ions and oxygen ions generated in the metal oxide treatment chamber 150 to the reaction chamber 110. The zinc oxide plate T may have an inclination of 15° to 30° and an inclined direction is directed toward the gate valve 157 which is a connection passage between the reaction chamber 110 and the metal oxide treatment chamber 150.

A distance between the zinc oxide plate T and the electron beam irradiator 155 may be between 600 and 1,800 mm and should not exceed 1,800 mm at most. In addition, when the number of substrates mounted on the substrate mounting unit 130 is large (for example, 108 4-inch substrates), the distance between the zinc oxide plate T and the substrate W may be appropriately 800 to 1,800 mm. If the distance is less than 800 mm, it is impossible to grow a uniform epi layer on the entire substrate W, and if the distance is greater than 1,800 mm, a uniform epi layer may be grown but a deposition rate may be too slow.

The gate valve 157 is installed on a partition separating the growth space 111 and the evaporation space 152, and is configured to selectively connect the evaporation space 152 to the growth space 111. Zinc ions and oxygen ions evaporated from the zinc oxide plate T may move to the growth space 111 only when the gate valve 157 is opened. A size of the gate valve 157 may be selected in proportion to a size of the substrate W. For example, the gate valve 157 may be selected to have a size of about 5 inches depending on the size of the metal oxide treatment chamber 151, and in a case of growing an epi-layer on a large-scale substrate of 1 m or grater (e.g., size of 40 4-inch substrates), a gate valve having a size of 14 inches or greater may be selected to increase deposition efficiency.

The camera 159 is installed in the evaporation space 152 to image an evaporation state of the zinc oxide plate T. Based on an image obtained from the camera 159, a manager may specify a replacement timing of the zinc oxide plate T. Further, a replacement door (not shown) that allows an operator to access the mount 153 may be installed in the metal oxide treatment chamber 151 to replace the zinc oxide plate T.

Furthermore, pump ports 235 and 236 connected to a second pump (not shown) in the vacuum control unit 230 may be installed in the metal oxide treatment chamber 151.

According to this configuration, the growth space 111 and the evaporation space 152 are independently controlled by the first pump 231 or the second pump, respectively, and when the process proceeds, both spaces should be maintained in an ultra-high vacuum state of $10^{-8}$ torr or less.

During the deposition process, the gate valve 157 should be opened to perform the process so that the gas generated in the zinc oxide plate T of the evaporation space 152 may smoothly move to the growth space 111. In the case of replacing the zinc oxide plate T, the gate valve 157 may be closed while maintaining the ultra-high vacuum state of the growth space 111, and only the vacuum state of the evaporation space 152 may be converted into atmospheric pressure, and then replacement may be performed.

Specifically, in the case of an epi-growth apparatus capable of mounting 40 4-inch substrates, a volume of the related art integrated chamber is calculated to be at least 3,600 L, and in the case of the separate chamber structure of the embodiment, a volume ratio of the reaction chamber 110 and the metal oxide treatment chamber 151 is 78:22, and is 2,808 L and 792 L, respectively. In the integrated chamber structure, it took 30 hours or longer to convert the chamber having a volume of 3,600 L from atmospheric pressure to an ultra-high vacuum state of $10^{-9}$ torr level at atmospheric pressure, but in the separate chamber structure according to the present embodiment, it takes about 2 hours to convert only the metal oxide treatment chamber 151 from an atmospheric pressure state to an ultra-high vacuum state. Since the reaction chamber 110 was continuously maintained in the ultra-high vacuum state, a subsequent process may be performed after 2 hours of converting the metal oxide treatment chamber 151 from the atmospheric pressure state to the ultra-high vacuum state.

In addition, most of the oxygen and ions injected from the reaction chamber 110 move toward the upper substrate W, and an extremely small amount of oxygen and ions moves to the zinc oxide plate T, the mount 153, the electron beam irradiator 155, and the like, located in the metal oxide treatment chamber 151. In this way, by preventing a reverse inflow of oxygen and ions into the evaporation space 152, the zinc oxide plate T and the like may be protected from oxidation. Therefore, the zinc oxide plate T may be used for a long time.

The separate chamber type epi-growth apparatus as described above is not limited to the configuration and operation method of the embodiments described above. The above embodiments may be configured so that all or a part of each of the embodiments may be selectively combined to make various modifications.

What is claimed is:

1. A separate chamber type epi-growth apparatus comprising:
    a reaction chamber having a growth space;
    a substrate mounting unit disposed in the growth space and allowing a substrate to be mounted thereon;
    a metal oxide treating unit having a metal oxide treatment chamber for treating a metal oxide in an evaporation space which is independent from the growth space so that metal ions and oxygen ions generated within the evaporation space from the metal oxide are supplied from the evaporation space to the substrate mounted in the growth space within the reaction chamber;
    an arsenic supply unit installed to face the substrate and supplying arsenic ions to the substrate mounted in the growth space;
    an oxygen radical supply unit installed to face the substrate and additionally supplying oxygen radicals to the substrate mounted in the growth space; and
    a vacuum control unit independently controlling a vacuum state of the reaction chamber and the metal oxide treating unit such that the metal ions and the oxygen ions pass from the evaporation space to the growth space; and
    wherein the substrate mounting unit is coupled, via at least one electromagnet, to a cradle that is installed in the reaction chamber.

2. The separate chamber type epi-growth apparatus of claim 1, wherein
    the metal oxide treating unit includes:
    the metal oxide treatment chamber having the evaporation space which is independent of the growth space, a connection passage being located between the reaction chamber and the metal oxide treatment chamber such that the connection passage separates the evaporation space from the growth space;
    a mount disposed in the evaporation space to face the growth space and allowing a zinc oxide plate as the metal oxide to be installed thereon;
    an electron beam irradiator irradiating the zinc oxide plate with an electron beam to cause zinc ions and oxygen ions to be evaporated from the zinc oxide plate; and
    the connection passage being a gate valve which is installed on a partition, the gate valve is configured to selectively open allowing the evaporation space to communicate with the growth space so that the evaporated zinc ions and the oxygen ions move toward the substrate located in the growth space.

3. The separate chamber type epi-growth apparatus of claim 2, wherein
    the vacuum control unit includes:
    a first pump acting on the growth space; and
    a second pump acting on the evaporation space, and
    wherein the second pump operates to control a vacuum state of the evaporation space independently from the growth space when the gate valve is closed.

4. The separate chamber type epi-growth apparatus of claim 2, wherein the gate valve is selected to have a size proportional to a size of the substrate.

5. The separate chamber type epi-growth apparatus of claim 2, wherein the metal oxide treatment chamber further includes a replacement door allowing access to the mount for replacement of the zinc oxide plate.

6. The separate chamber type epi-growth apparatus of claim 2, wherein the substrate mounting unit and the electron beam irradiator are located at a level corresponding to an upper side of the reaction chamber, and the mount is located at a level corresponding to a lower side of the reaction chamber.

7. The separate chamber type epi-growth apparatus of claim 2, wherein the metal oxide treating unit further includes a camera installed in the evaporation space and imaging an evaporation state of the zinc oxide plate.

8. The separate chamber type epi-growth apparatus of claim 1, wherein the arsenic supply unit operates in a range of 500° C. to 1,100° C. to ionize arsenic, and supply $As_2^+$ as the arsenic ions.

9. The separate chamber type epi-growth apparatus of claim 1, wherein the oxygen radical supply unit and the arsenic supply unit are located on mutually opposite sides with respect to the substrate mounting unit.

10. The separate chamber type epi-growth apparatus of claim 1, wherein a driving unit is mounted to the reaction chamber and the cradle is coupled to the driving unit, and the driving unit is actuatable to move the substrate mounting unit, within the reaction chamber, along a vertical axis and to rotate the substrate mounting unit about the vertical axis.

11. The separate chamber type epi-growth apparatus of claim 1, wherein the oxygen radical supply unit and the metal oxide treating unit are operable to supply a ratio of Zn:O of 1:1.

12. The separate chamber type epi-growth apparatus of claim 1, wherein a heater unit is installed on a mount to surround the zinc oxide plate such that a zinc oxide plate is divided into at least five temperature regions, and the heater unit differentially heats the at least five temperature regions such that a temperature difference between each of the regions is less than or equal to 300° C.

* * * * *